US012706818B2

(12) United States Patent
Furuta et al.

(10) Patent No.: US 12,706,818 B2
(45) Date of Patent: Aug. 11, 2026

(54) COLLECTING DEVICE, COLLECTING METHOD, AND COLLECTING PROGRAM

(71) Applicant: NTT, Inc., Tokyo (JP)

(72) Inventors: Akinori Furuta, Tokyo (JP); Yuhei Hayashi, Tokyo (JP); Atsushi Suto, Tokyo (JP); Chiharu Morioka, Tokyo (JP); Yuki Miyoshi, Tokyo (JP); Satomi Inoue, Tokyo (JP); Masato Yamada, Tokyo (JP)

(73) Assignee: NTT, Inc., Tokyo (JP)

( * ) Notice: Subject to any disclaimer, the term of this patent is extended or adjusted under 35 U.S.C. 154(b) by 182 days.

(21) Appl. No.: 18/837,973

(22) PCT Filed: Feb. 15, 2022

(86) PCT No.: PCT/JP2022/005826

§ 371 (c)(1),
(2) Date: Aug. 13, 2024

(87) PCT Pub. No.: WO2023/157052

PCT Pub. Date: Aug. 24, 2023

(65) Prior Publication Data

US 2025/0150366 A1 May 8, 2025

(51) Int. Cl.

| | |
|---|---|
| ***H04L 43/026*** | (2022.01) |
| ***G01R 19/00*** | (2006.01) |
| ***G06F 40/289*** | (2020.01) |
| ***G06Q 10/06*** | (2023.01) |
| ***H04L 47/25*** | (2022.01) |

(52) U.S. Cl.

CPC ........ *H04L 43/026* (2013.01); *G01R 19/0092* (2013.01); *G06F 40/289* (2020.01); *G06Q 10/06* (2013.01); *H04L 47/25* (2013.01)

(58) Field of Classification Search

CPC ... H04L 9/0631; H04L 9/0825; H04L 9/3066; H04L 43/026; H04L 41/142; H04L 43/02; G06F 21/57; G06F 21/6209; G06F 21/53; G06F 21/606; G06F 21/6254; G10L 15/22; G10L 15/28

See application file for complete search history.

(56) References Cited

U.S. PATENT DOCUMENTS

| | | | | |
|---|---|---|---|---|
| 2017/0012902 | A1* | 1/2017 | Shen | H04L 43/026 |
| 2018/0048531 | A1 | 2/2018 | Nishioka | |
| 2019/0140958 | A1* | 5/2019 | Hasani | H04L 47/25 |
| 2021/0075690 | A1* | 3/2021 | Janakiraman | G06F 40/289 |
| 2021/0181243 | A1* | 6/2021 | Jefferies | G01R 19/0092 |

FOREIGN PATENT DOCUMENTS

| | | | | |
|---|---|---|---|---|
| EP | 2325791 | A1 * | 5/2011 | G06Q 10/06 |
| JP | 2006148376 | A | 6/2006 | |
| WO | 2016147613 | A1 | 9/2016 | |

OTHER PUBLICATIONS

Valluri et al. (2004) Cisco Systems Net Flow Services Export Version 9" Network Working Group Request for Comments: 3954, Oct. 2004 [online] website: https://datatracker.ietf.org/doc/html/rfc3954.html, 33 pages.

* cited by examiner

*Primary Examiner* — Kyung H Shin

(57) ABSTRACT

A specification unit (15*b*) specifies a path of traffic on the basis of past flow information. A determination unit (15*c*) determines a network device on the specified path for traffic related to a designated event.

20 Claims, 6 Drawing Sheets

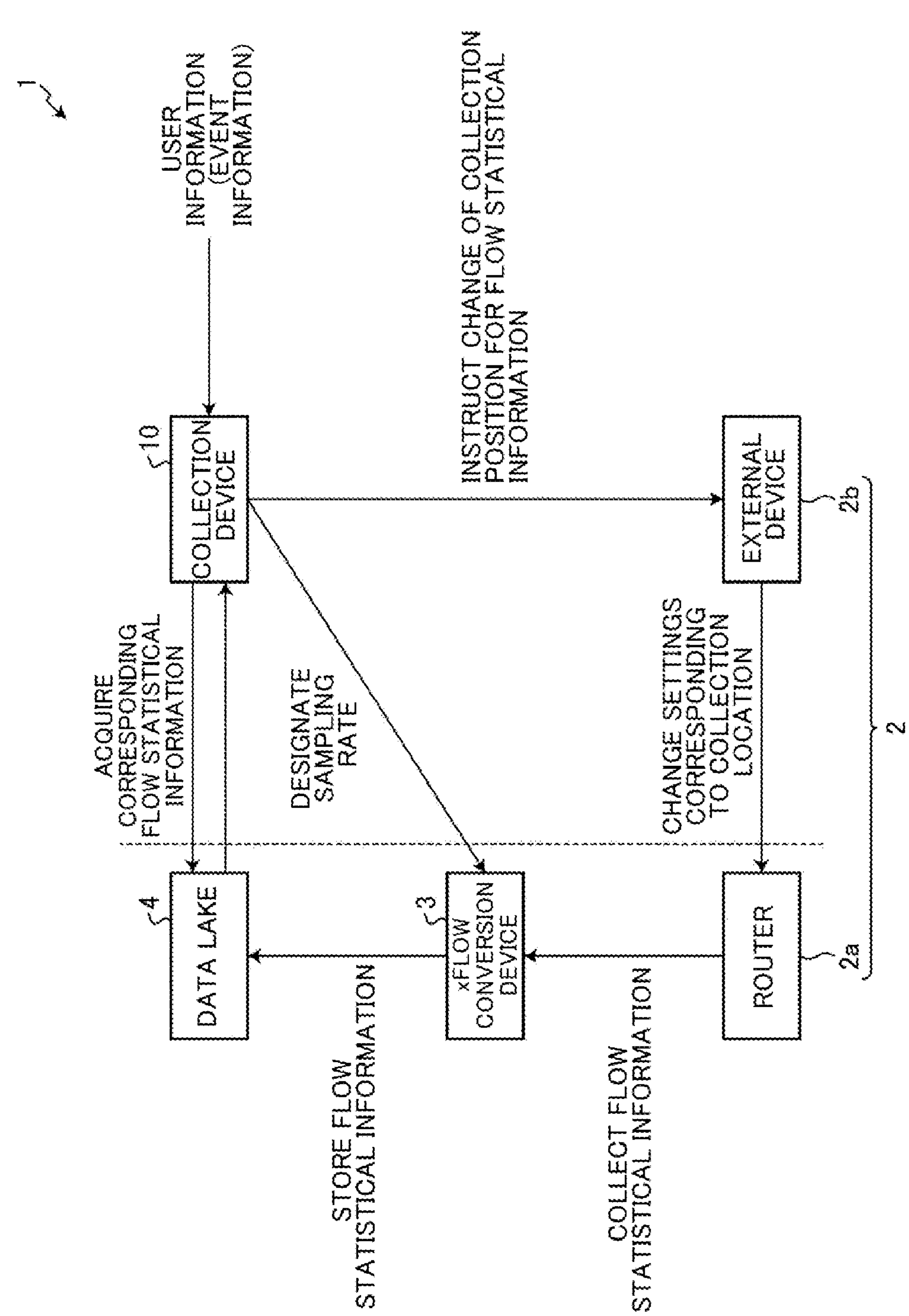
Fig. 2
1
USER INFORMATION (EVENT INFORMATION)
10
COLLECTION DEVICE
INSTRUCT CHANGE OF COLLECTION POSITION FOR FLOW STATISTICAL INFORMATION
EXTERNAL DEVICE
2b
ACQUIRE CORRESPONDING FLOW STATISTICAL INFORMATION
DESIGNATE SAMPLING RATE
CHANGE SETTINGS CORRESPONDING TO COLLECTION LOCATION
2
4
DATA LAKE
3
xFLOW CONVERSION DEVICE
ROUTER
2a
STORE FLOW STATISTICAL INFORMATION
COLLECT FLOW STATISTICAL INFORMATION

COLLECTING DEVICE, COLLECTING METHOD, AND COLLECTING PROGRAM

CROSS-REFERENCE TO RELATED APPLICATIONS

This application is a U.S. 371 Application of International Patent Application No. PCT/JP2022/005826, filed on 15 Feb. 2022, the disclosure of which is hereby incorporated herein by reference in its entirety.

TECHNICAL FIELD

The present invention relates to a collection device, a collection method, and a collection program.

BACKGROUND ART

NetFlow is known as a technique for transmitting flow statistical information in a network (see NPL 1).

CITATION LIST

Non Patent Literature

[NPL 1] "RFC3954 Cisco Systems NetFlow Services Export Version 9," [online], October 2004, [searched on Jan. 11, 2022], Internet <URL: https://datatracker.ietf.org/doc/html/rfc3954.html>

SUMMARY OF INVENTION

Technical Problem

However, according to the prior art, it is difficult to intensively monitor an event to be monitored while considering network restrictions. For example, since a communication path to a data lake for storing flow statistical information is not abundant in a complicated and large-scale carrier network, it is necessary to reduce the collection granularity of the flow statistical information, and it is difficult to detect a failure or a security threat in a timely manner. On the other hand, in order to monitor events such as important user declaration, DDOS attack, OS update, OTT (Over The Top) failure, information of all events need to be collected, which is an enormous amount of information, making it difficult to intensively monitor traffic of required events.

The present invention has been made in view of the above-mentioned problems, and an object thereof is to perform intensive monitoring of an event to be monitored while considering network restrictions.

Solution to Problem

In order to solve the above-mentioned problems and achieve the object, a collection device according to the present invention includes a specification unit that specifies a path of traffic on the basis of past flow information, and a determination unit that determines a network device on the specified path for traffic related to a designated event.

Advantageous Effects of Invention

According to the present invention, it is possible to intensively monitor an event to be monitored while considering network restrictions.

BRIEF DESCRIPTION OF DRAWINGS

FIG. 2 is a diagram for explaining a configuration of a collection system including the collection device.

DESCRIPTION OF EMBODIMENTS

Figure 1:
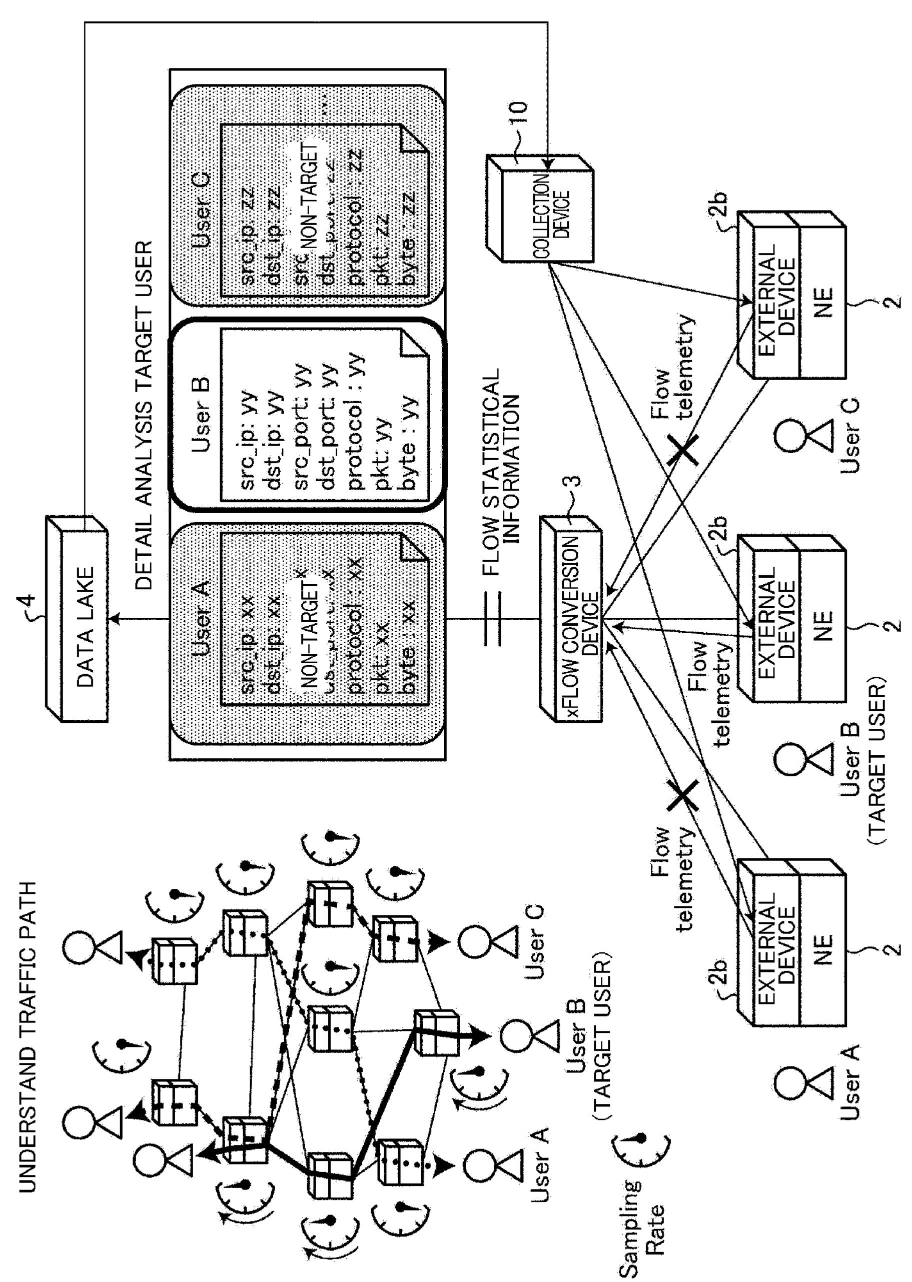
FIG. 1 is a diagram for explaining an overview of a collection device according to an embodiment.

An embodiment of the present invention will be described hereinafter in detail with reference to the drawings. Note that the present invention is not limited by the embodiment. Furthermore, the same constituent elements are denoted by the same reference numerals in the description of the drawings.

Overview of Collection Device

FIG. 1 is a diagram for explaining an overview of a collection device according to the present embodiment. When an event such as important user declaration, DDOS attack, OS update, or OTT failure occurs, a collection device 10 intensively monitors network devices 2 (NE, Network Element) and IF (Interface), such as routers, arranged on the traffic exchange.

Specifically, the collection device 10 solves a traffic path in advance on the basis of flow information obtained at normal time and stored in a data lake 4. When an event occurs, the collection device 10 determines a router and an IF through which the traffic of a corresponding user passes, defines the router and IF as a monitoring target, increases a sampling rate of the IF of the user, and performs control so as to collect flow statistical information from a xFlow conversion device 3.

Thus, the collection device 10 can collect the maximum amount of flow statistical information to be monitored intensively while reducing information as a whole, and can capture events that occur infrequently. If the number of combinations of all routers and IFs is N, and the number of combinations of routers and IFs through which event-related traffic passes is K, the information reduction effect is K/N.

Configuration of Collection System

FIG. 2 is a diagram for explaining a configuration of a collection system including the collection device. As shown in FIG. 2, a collection system 1 includes, in addition to the collection device 10, a router 2 on a VPN, an xFlow conversion device 3, and a data lake 4.

In the router 2, the function of an external device **2*b* related to collection processing to be described later is added to the function of a conventional router 2*a*. The external device 2*b* is implemented using an NP (Network Processor) or the like, and as described later, according to instructions from the collection device 10, changes settings such as output/stop of flow statistical information to be collected for the router 2*a***.

The xFlow conversion device 3 collects flow statistical information from the router **2*a* and stores the collected flow statistical information in the data lake 4. In so doing, the xFlow conversion device 3 collects the flow statistical information at a sampling rate designated by collection processing to be described later. The data lake 4** is realized by a database device or the like and stores the collected flow statistical information.

As will be described later, the collection device 10 previously solves traffic paths by using normal flow statistical information acquired from the data lake 4. Upon reception event information and user information of an event to be monitored, the collection device 10 specifies a traffic path related to the event, determines the router 2 on the path, and sets the router 2 as a target of intensive collection of the flow statistical information. Then, the collection device 10 instructs the external device 2*b* of the router 2, which is the target for collecting the flow statistical information, to change settings according to a collection location, such as output/stop of the flow statistical information to be collected.

Configuration of Collection Device

Figure 3:
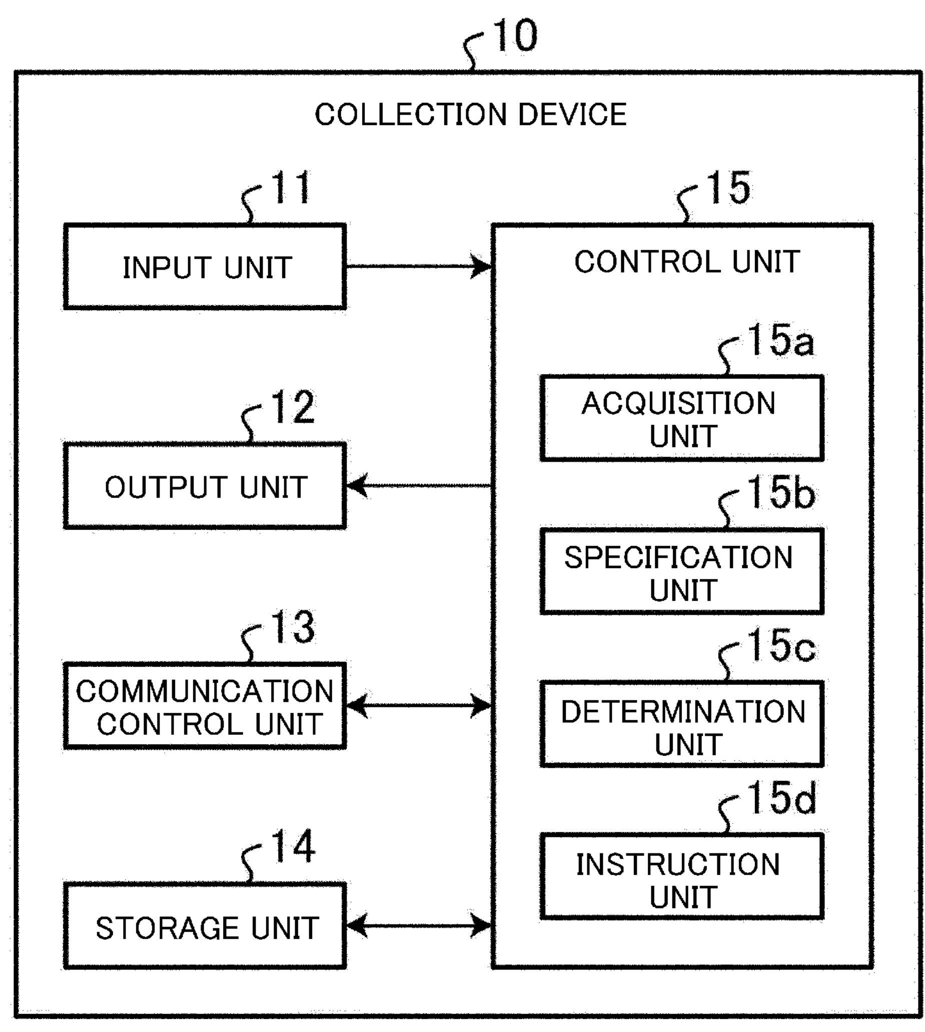
FIG. 3 is a schematic diagram illustrating a schematic configuration of the collection device.

FIG. 3 is a schematic diagram illustrating a schematic configuration of the collection device. As exemplified in FIG. 3, the collection device 10 according to the present embodiment is implemented by a general computer such as a personal computer, and includes an input unit 11, an output unit 12, a communication control unit 13, a storage unit 14, and a control unit 15.

The input unit 11 is implemented by using an input device such as a keyboard or a mouse, and inputs various types of instruction information, such as start of processing, to the control unit 15 in response to an input operation by an operator. The output unit 12 is realized by a display device such as a liquid crystal display, a printing device such as a printer, or the like. For example, a result of detection processing to be described below is displayed on the output unit 12.

The communication control unit 13 is implemented by a NIC (Network Interface Card) or the like and controls communication between an external device and the control unit 15 via a telecommunication line such as a LAN (Local Area Network) or the Internet. For example, the communication control unit 13 controls communication between the router 2, the xFlow conversion device 3 for outputting flow statistical information of the router 2, the data lake 4, and the like, and the control unit 15.

The storage unit 14 is realized by a semiconductor memory element such as a random access memory (RAM) or a flash memory, or a storage device such as a hard disk or an optical disc. The storage unit 14 stores in advance, for example, a processing program for operating the collection device 10 and data to be used during the execution of the processing program, or the storage unit 14 stores the processing program and the data temporarily every time the processing is executed. Note that the storage unit 14 may also be configured to communicate with the control unit 15 via the communication control unit 13.

The control unit 15 is implemented by using a CPU (Central Processing Unit) or the like and executes a processing program stored in a memory. Thus, as exemplified in FIG. 3, the control unit 15 functions as an acquisition unit 15*a*, a specification unit 15*b*, a determination unit 15*c*, and an instruction unit 15*d*. Note that each or some of these functional units may be implemented in different hardware. For example, the acquisition unit 15*a* may be implemented as a device different from the other functional units. Also, the control unit 15 may include the other functional units.

The acquisition unit 15*a* acquires past flow information. For example, the acquisition unit 15*a* acquires normal flow information stored in the data lake 4 via the input unit 11 or the communication control unit 13.

The acquisition unit 15*a* may store the acquired past flow information in the storage unit 14 prior to the collection processing to be described later. Alternatively, the acquisition unit 15*a* may transfer such information to the specification unit 15*b* to be described below without storing said information in the storage unit 14.

The specification unit 15*b* specifies a traffic path on the basis of the past flow information. Specifically, the specification unit 15*b* solves the traffic path for the normal flow information acquired from the data lake 4.

The determination unit 15*c* determines the router 2 on the specified path for traffic related to the designated event. Specifically, when information designating an event to be monitored is input via the input unit 11 or the communication control unit 13, the determination unit 15*c* determines the router 2 and the IF on the traffic path related to the event specified by the specification unit 15*b*. For example, the determination unit 15*c* determines the router 2 and the IF of traffic of a UserB of the event, as illustrated in FIG. 1.

The instruction unit 15*d* instructs collection of the flow statistical information from the determined router 2. Specifically, the instruction unit 15*d* instructs the external device 2*b* of the determined router 2, via the communication control unit 13, to change the settings to output the flow statistical information to the xFlow conversion device 3.

For example, in the example shown in FIG. 1, the instruction unit 15*d* instructs the external device 2*b* of the router 2 in which the UserB is housed, to output the flow statistical information. On the other hand, the instruction unit 15*d* instructs the external device 2*b* of the router 2 in which a UserA and UserC are housed, to stop the output of the flow statistical information. Thus, the collection system 1 can collect the flow statistical information limited to the UserB related to the event.

The instruction unit 15*d* may also instruct the collection of the flow statistical information from the determined router 2 in such a manner that the collection granularity thereof is higher than the collection granularity of flow statistical information from routers 2 other than this router 2. Specifically, the instruction unit 15*d* designates the xFlow conversion device 3 so that the sampling rate from the determined router 2 is made higher than the sampling rates of the other routers 2.

Thus, the collection system 1 can intensively collect the flow statistical information of the traffic to be monitored, and can minimize the collection of the flow statistical information of the other traffic. Therefore, the flow statistical information of the traffic to be monitored can be collected to the maximum in consideration of network restrictions.

Collection Processing

Figure 4:
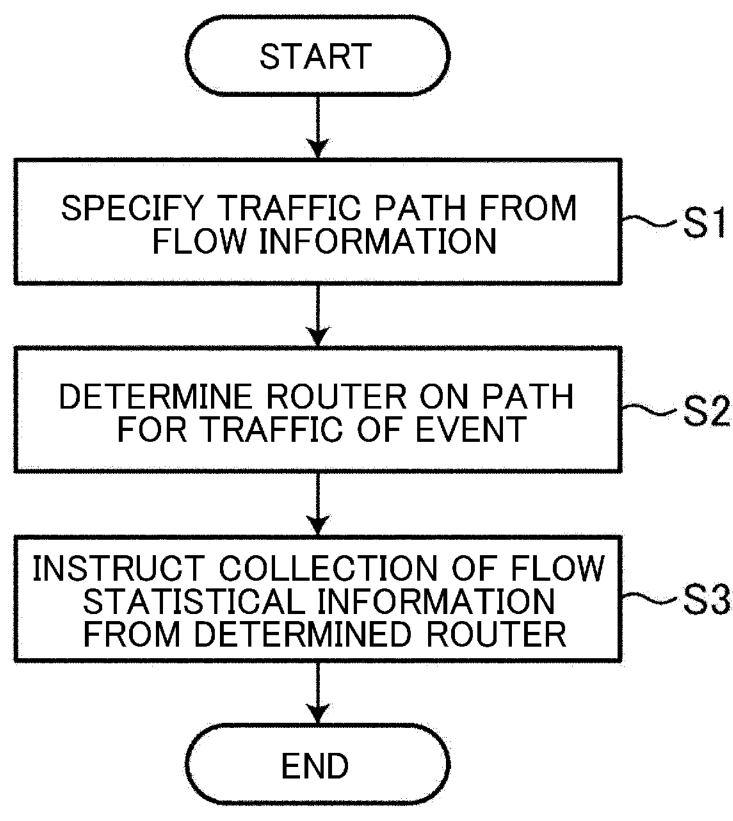
FIG. 4 is a flowchart showing a collection processing procedure.

Next, the collection processing by the collection device 10 according to the present embodiment will be described with reference to FIG. 4. FIG. 4 is a flowchart showing a collection processing procedure. The flow chart shown in FIG. 4 starts at the timing when the user makes an operation input indicating the start.

First, the acquisition unit 15*a* acquires normal flow information from the data lake 4. The specification unit 15*b* specifies a traffic path on the basis of the acquired normal flow information (step S1).

When information for designating an event is input, the specification unit 15*b* specifies a traffic path related to the event, and the determination unit 15*c* determines the router 2 and the IF on the traffic path (step S2).

Then, the instruction unit 15*d* instructs the collection of the flow statistical information from the determined router 2 (step S3). Specifically, the instruction unit 15*d* instructs the external device 2*b* of the determined router 2 to output the flow statistical information to the xFlow conversion device 3, via the communication control unit 13. The instruction unit 15*d* instructs the external device 2*b* of another router 2 to stop the output of the flow statistical information to the xFlow conversion device 3.

Alternatively, the instruction unit 15*d* designates a sampling rate from each router 2 to the xFlow conversion device 3. In so doing, the instruction unit 15*d* designates the xFlow conversion device 3 in such a manner that the sampling rate from the determined router 2 is made higher than the sampling rates of the other routers 2. In this manner, the series of collection processes ends.

Thereafter, the flow statistical information from the determined router 2 is intensively collected by the xFlow conversion device 3 and stored in the data lake 4.

Effects

As described above, in the collection device 10 of the present embodiment, the specification unit 15*b* specifies a traffic path on the basis of the past flow information. The determination unit 15*c* determines a network device (router) 2 on the specified path for traffic related to the designated event.

Figure 5:
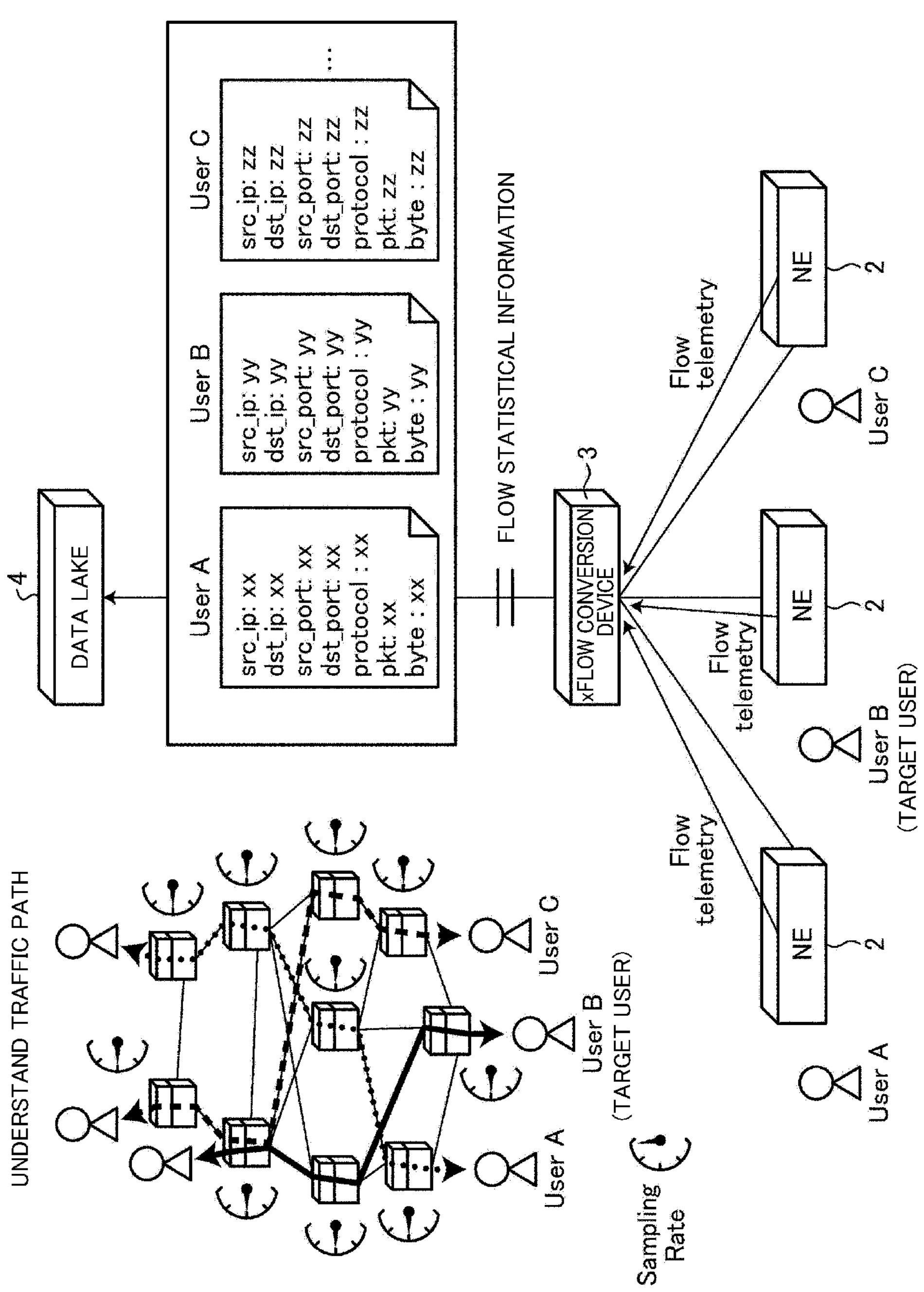
FIG. 5 is a diagram for explaining the prior art.

FIG. 5 a diagram for explaining the prior art. As shown in FIG. 5, according to the xFlow including the conventional NetFlow, it is difficult to change the sampling rate of the flow statistical information to be collected, for each user. Therefore, even if there is an event related to a user who wants to perform intensive monitoring, the amount of information to be collected becomes enormous, making it difficult to monitor the event extensively.

On the other hand, according to the collection device 10 of the present embodiment, it is possible to determine the router 2 through which the traffic related to the event passes as the router 2 to be subjected to the intensive monitoring. Therefore, it is possible to collect the maximum amount of flow statistical information subjected to intensive monitoring and to capture events that occur infrequently, while reducing information as a whole. In this manner, the event to be monitored can be intensively monitored while taking network restrictions into consideration.

Further, the instruction unit 15*d* instructs the collection of flow statistical information from the determined router 2. Thus, the collection device 10 can collect flow statistical information only for an event to be subjected to intensive monitoring.

In addition, the instruction unit 15*d* instructs the collection of the flow statistical information from the determined router 2 in such a manner that the collection granularity thereof is higher than the collection granularity of flow statistical information from routers 2 other than this router 2. Thus, the flow statistical information of the traffic to be monitored can be intensively collected, and the collection of the flow statistical information of the other traffic can be minimized. In this manner, the collection device 10 can collect the maximum amount of flow statistical information of the traffic to be monitored, by taking network restrictions into consideration.

[Program]

It is also possible to create a program that describes the processing executed by the collection device 10 according to the foregoing embodiment in a language that can be executed by a computer. In one embodiment, the collection device 10 can be implemented by installing a collection program that executes the above-described collection processing as package software or online software on a desired computer. For example, an information processing device can be caused to function as the collection device 10 by causing the information processing device to execute the above-described collection program. The information processing device mentioned here may be a desktop or laptop personal computer. Further, a mobile communication terminal such as a smartphone, a mobile phone, or a PHS (Personal Handyphone System), or a slate terminal such as a PDA (Personal Digital Assistant), for example, is included in the category of the information processing device. Furthermore, the functions of the collection device 10 may be implemented in a cloud server.

Figure 6:
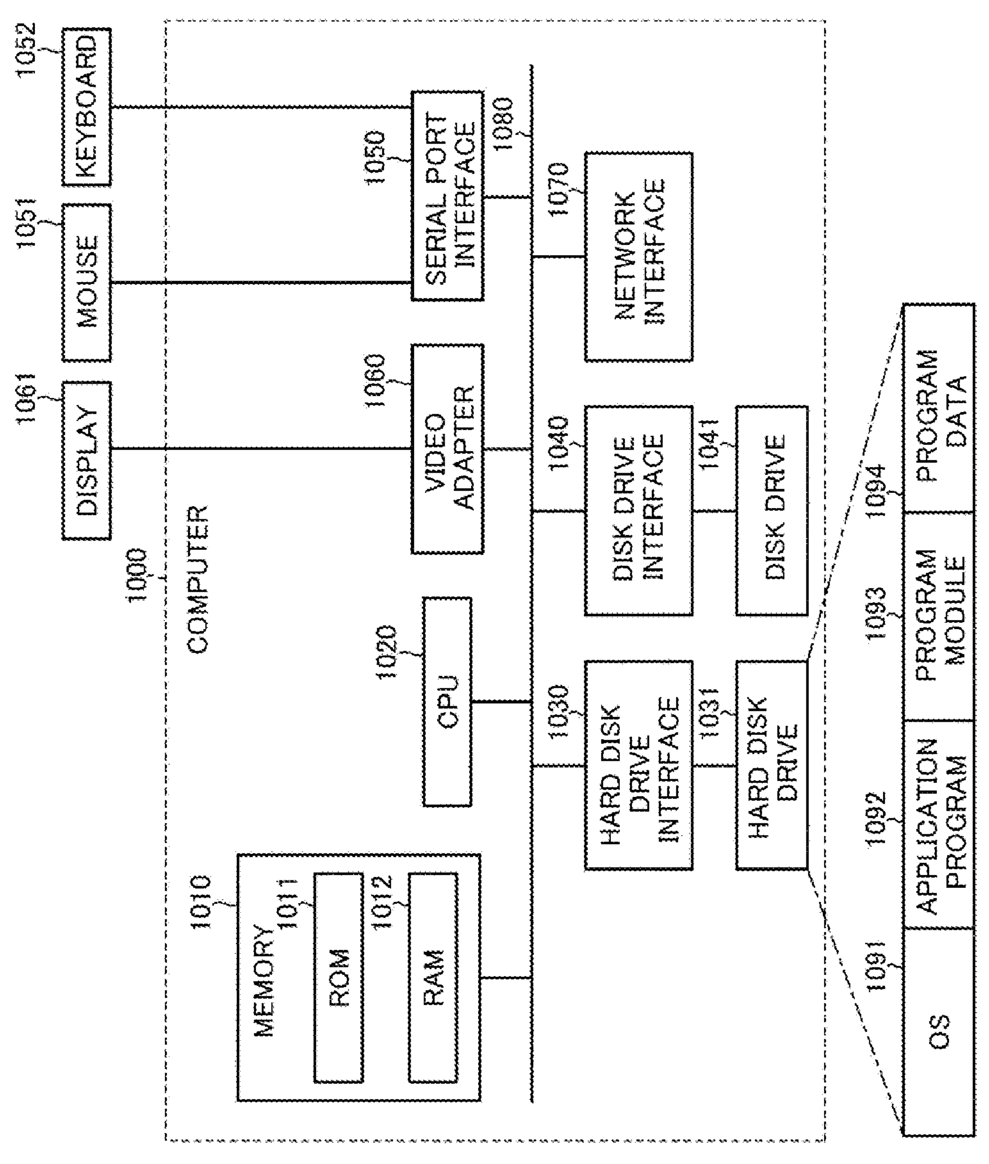
FIG. 6 is a diagram showing an example of a computer that executes a collection program.

FIG. 6 is a diagram showing an example of a computer that executes the collection program. A computer 1000 has a memory 1010, a CPU 1020, a hard disk drive interface 1030, a disk drive interface 1040, a serial port interface 1050, a video adapter 1060, and a network interface 1070, for example. These units are connected by a bus 1080.

The memory 1010 includes a ROM (Read Only Memory) 1011 and a RAM 1012. The ROM 1011 stores, for example, a boot program, such as a BIOS (Basic Input Output System). The hard disk drive interface 1030 is connected to a hard disk drive 1031. The disk drive interface 1040 is connected to a disk drive 1041. A removable storage medium such as a magnetic disk or an optical disc is inserted into the disk drive 1041. For example, a mouse 1051 and a keyboard 1052 are connected to the serial port interface 1050. For example, a display 1061 is connected to the video adapter 1060.

Here, the hard disk drive 1031 stores, for example, an OS 1091, an application program 1092, a program module 1093, and program data 1094. Each of the pieces of information described in the foregoing embodiment is stored in, for example, the hard disk drive 1031 or the memory 1010.

The collection program is stored in the hard disk drive 1031 as a program module 1093 in which commands executed by the computer 1000 are described, for example. Specifically, the program module 1093 in which each processing executed by the collection device 10 described in the foregoing embodiment is written is stored in the hard disk drive 1031.

The data used in information processing performed by the collection program is stored in, for example, the hard disk drive 1031 as the program data 1094. Thereafter, the CPU 1020 reads the program module 1093 and the program data 1094 stored in the hard disk drive 1031 into the RAM 1012 when necessary, and executes each of the procedures described above.

Note that the storage of the program module 1093 and the program data 1094 related to the collection program is not limited to the case where the program module 1093 and the program data 1094 are stored in the hard disk drive 1031; the program module 1093 and the program data 1094 may be stored in, for example, a detachable storage medium and may be read by the CPU 1020 via the disk drive 1041 or the like. Alternatively, the program module 1093 and the program data 1094 related to the collection program may be stored in another computer connected via a network such as a LAN or a WAN (Wide Area Network), and read by the CPU 1020 via the network interface 1070.

Although the embodiments to which the invention made by the present inventor is applied have been described above, the present invention is not limited by the descriptions and drawings forming a part of the disclosure of the present invention according to the embodiments. That is to say, other embodiments, examples, operation techniques, and the like made by those skilled in the art on the basis of the embodiments are all included in the scope of the present invention.

REFERENCE SIGNS LIST

1 Collection system
2, 2*a* Network device (router)
2*b* External device
3 xFlow conversion device
4 Data lake
10 Collection device
11 Input unit
12 Output unit
13 Communication control unit
14 Storage unit
15 Control unit
15*a* Acquisition unit
15*b* Specification unit
15*c* Determination unit
15*d* Instruction unit

The invention claimed is:

1. A collection device comprising a processor configured to execute operations comprising:
- receiving a designated event that has occurred in a first network device;
- identifying a path of traffic on the basis of past flow information of a normal data traffic, and the normal data traffic describes data at least in the first network device;
- determining a second network device on the specified path for traffic related to the designated event, wherein the second network device collects flow statistical information of the normal data traffic according a first collection granularity and transmits the flow statistical information over a network for storing in a memory device; and
- causing the second network device to collect, future flow statistical information of a future data traffic according a second collection granularity and transmit the future flow statistical information over the network for storing in the memory device, wherein the second collection granularity is distinct from the first collection granularity.

2. The collection device according to claim 1, the processor further configured to execute operations comprising:
- transmitting an instruction code over the network to the determined second network device, wherein the instruction code comprises collecting the future flow statistical information of a part of data traffic associated with the designated event on the network by the determined second network device.

3. The collection device according to claim 2, wherein the causing to collect further comprises causing the determined second network device to transmit the future flow statistical information, the second collection granularity specifies a sampling rate of collecting the future flow statistical information of the future data traffic, and the second collection granularity that is higher than the first collection granularity.

4. The collection device according to claim 1, wherein the past flow information of data over the network represents a normal operation of computing devices in the network.

5. The collection device according to claim 1, wherein the designated event represents a security threat to the first network device for causing an enhanced monitoring of network traffic.

6. The collection device according to claim 1, wherein the second network device is distinct from the first network device.

7. The collection device according to claim 1, wherein the memory device comprises a data lake.

8. A computer-executable method, comprising:
- a receiving step of receiving a designated event that has occurred in a first network device;
- a specification step of specifying a path of traffic on the basis of past flow information of a normal data traffic, and the normal data traffic describes data at least in the first network device;
- a determination step of determining a second network device on the specified path for traffic related to the designated event, wherein the second network device collects flow statistical information of the normal data traffic according a first collection granularity and transmits the flow statistical information over a network for storing in a memory device; and
- causing the second network device to collect, future flow statistical information of a future data traffic according a second collection granularity and transmit the future flow statistical information over the network for storing in the memory device, wherein the second collection granularity is distinct from the first collection granularity.

9. The computer-executable method according to claim 8, further comprising:
- transmitting an instruction code over the network to the determined second network device, wherein the instruction code comprises collecting the future flow statistical information of a part of data traffic associated with the designated event on the network by the determined second network device.

10. The computer-executable method according to claim 9, wherein the causing to collect further comprises causing the determined second network device to transmit the future flow statistical information, the second collection granularity specifies a sampling rate of collecting the future flow statistical information of the future data traffic, and the second collection granularity that is higher than the first collection granularity.

11. The computer-executable method according to claim 8, wherein the past flow information of data over the network represents a normal operation of computing devices in the network.

12. The computer-executable method according to claim 8, wherein the designated event represents a security threat to the first network device for causing an enhanced monitoring of network traffic.

13. The computer-executable method according to claim 8, wherein the second network device is distinct from the first network device.

14. The computer-executable method according to claim 8, wherein the memory device comprises a data lake.

15. A computer-readable non-transitory recording medium storing a computer-executable program instructions that when executed by a processor cause a computer to execute operations comprising:

a receiving step of receiving a designated event that has occurred in a first network device;

a specification step of specifying a path of traffic on the basis of past flow information of a normal data traffic, and the normal data traffic describes data at least in the first network device;

a determination step of determining a second network device on the specified path for traffic related to the designated event, wherein the second network device collects flow statistical information of the normal data traffic according a first collection granularity and transmits the flow statistical information over a network for storing in a memory device; and causing the second network device to collect, future flow statistical information of a future data traffic according a second collection granularity and transmit the future flow statistical information over the network for storing in the memory device, wherein the second collection granularity is distinct from the first collection granularity.

16. The computer-readable non-transitory recording medium according to claim 15, the computer-executable program instructions when executed further causing the computer to execute operations comprising:

transmitting an instruction code over the network to the determined second network device, wherein the instruction code comprises collecting the future flow statistical information of a part of data traffic associated with the designated event on the network by the determined second network device.

17. The computer-readable non-transitory recording medium according to claim 16, wherein the causing to collect further comprises causing the determined second network device to transmit the future flow statistical information, the second collection granularity specifies a sampling rate of collecting the future flow statistical information of the future data traffic, and the second collection granularity that is higher than the first collection granularity.

18. The computer-readable non-transitory recording medium according to claim 15, wherein the past flow information of data over the network represents a normal operation of computing devices in the network.

19. The computer-readable non-transitory recording medium according to claim 15, wherein the designated event represents a security threat to the first network device for causing an enhanced monitoring of network traffic.

20. The computer-readable non-transitory recording medium according to claim 15, wherein the second network device is distinct from the first network device, and the memory device comprises a data lake.

* * * * *